United States Patent
Deokar et al.

(10) Patent No.: US 9,231,439 B2
(45) Date of Patent: Jan. 5, 2016

(54) SYSTEM AND METHOD FOR ESTIMATING AN EFFICIENCY OF A POWER DEVICE

(75) Inventors: Vishwas Mohaniraj Deokar, Acton, MA (US); James S. Spitaels, Shrewsbury, MA (US); Fred W. Rodenhiser, Wilmington, MA (US); Lynn Ernest Schultz, Nashua, NH (US); Kyle Brookshire, Belmont, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 646 days.

(21) Appl. No.: 12/412,645

(22) Filed: Mar. 27, 2009

(65) Prior Publication Data

US 2010/0250192 A1 Sep. 30, 2010

(51) Int. Cl.
*H02J 9/06* (2006.01)
*G01R 31/40* (2014.01)
*H02J 7/00* (2006.01)

(52) U.S. Cl.
CPC .................. *H02J 9/061* (2013.01); *G01R 31/40* (2013.01); *H02J 7/00* (2013.01); *Y10T 307/625* (2015.04)

(58) Field of Classification Search
CPC ............ H02J 9/061; H02J 7/00; G01R 31/40; Y10T 307/625
USPC .............................................. 702/60–62, 182
See application file for complete search history.

(56) References Cited

U.S. PATENT DOCUMENTS

| 4,217,645 A | 8/1980 | Barry et al. |
|---|---|---|
| 4,394,741 A | 7/1983 | Lowndes |
| 4,564,767 A | 1/1986 | Charych |
| 4,692,632 A | 9/1987 | Gaul et al. |
| 4,782,241 A | 11/1988 | Baker et al. |
| 5,019,717 A | 5/1991 | McCurry et al. |
| 5,126,585 A | 6/1992 | Boys |
| 5,170,124 A | 12/1992 | Blair et al. |
| 5,184,025 A | 2/1993 | McCurry et al. |
| 5,291,383 A | 3/1994 | Oughton |
| 5,315,533 A | 5/1994 | Stich et al. |

(Continued)

FOREIGN PATENT DOCUMENTS

| WO | 2005027305 A1 | 3/2005 | |
|---|---|---|---|
| WO | WO 2005/027305 | * 3/2005 | ................ H02J 9/06 |

OTHER PUBLICATIONS

Alexandre S. Martins et al. "Control Strategy for the Double-Boost Converter in Continuous Conduction Mode Applied to Power Factor Correction", . Federal University of Santa Catarina, Dept. of Electrical Engineering, Power Electronics Institute, Brazil, 0-7803-3500-7/96, 1996 IEEE, pp. 1066-1072, http://ieeexplore.ieee.org/stamp/stamp.jsp?tp=&arnum.*

(Continued)

*Primary Examiner* — Alexander Satanovsky
(74) *Attorney, Agent, or Firm* — Lando & Anastasi LLP

(57) ABSTRACT

A method for estimating an efficiency of a power device includes identifying a state of operation of the power device, measuring power-related information produced by the power device, and determining an estimated efficiency of the power device based in part on the state of operation of the power device and power loss parameters associated with the power device by using the measured power-related information. Other methods and devices for measuring efficiency are further disclosed.

34 Claims, 4 Drawing Sheets

(56) References Cited

U.S. PATENT DOCUMENTS

| | | | |
|---|---|---|---|
| 5,319,571 A | 6/1994 | Langer et al. | |
| 5,321,626 A | 6/1994 | Palladino | |
| 5,321,627 A | 6/1994 | Reher | |
| 5,325,041 A | 6/1994 | Briggs | |
| 5,381,554 A | 1/1995 | Langer et al. | |
| 5,455,499 A | 10/1995 | Uskali et al. | |
| 5,458,991 A | 10/1995 | Severinsky | |
| 5,579,197 A | 11/1996 | Mengelt et al. | |
| 5,596,259 A * | 1/1997 | Mino et al. | 320/157 |
| 5,602,462 A | 2/1997 | Stich et al. | |
| 5,664,202 A | 9/1997 | Chen et al. | |
| 5,666,040 A | 9/1997 | Bourbeau | |
| 5,781,448 A * | 7/1998 | Nakamura et al. | 700/293 |
| 5,793,627 A | 8/1998 | Caldes et al. | |
| 5,886,890 A | 3/1999 | Ishida et al. | |
| 5,923,099 A | 7/1999 | Bilir | |
| 6,031,354 A | 2/2000 | Wiley et al. | |
| 6,170,007 B1 | 1/2001 | Venkatraman et al. | |
| 6,175,511 B1 | 1/2001 | Ooba | |
| 6,184,593 B1 | 2/2001 | Jungreis | |
| 6,201,319 B1 | 3/2001 | Simonelli et al. | |
| 6,201,371 B1 | 3/2001 | Kawabe et al. | |
| 6,204,574 B1 | 3/2001 | Chi | |
| 6,268,711 B1 | 7/2001 | Bearfield | |
| 6,274,950 B1 | 8/2001 | Gottlieb et al. | |
| 6,285,178 B1 | 9/2001 | Ball et al. | |
| 6,301,674 B1 | 10/2001 | Saito et al. | |
| 6,329,792 B1 | 12/2001 | Dunn et al. | |
| 6,433,444 B1 | 8/2002 | de Vries | |
| 6,465,910 B2 | 10/2002 | Young et al. | |
| 6,469,471 B1 | 10/2002 | Anbuky et al. | |
| 6,493,243 B1 | 12/2002 | Real | |
| 6,549,014 B1 | 4/2003 | Kutkut et al. | |
| 6,584,329 B1 | 6/2003 | Wendelrup et al. | |
| 6,700,351 B2 | 3/2004 | Blair et al. | |
| 6,784,641 B2 | 8/2004 | Sakai et al. | |
| 6,795,322 B2 | 9/2004 | Aihara et al. | |
| 6,854,065 B2 | 2/2005 | Smith et al. | |
| 6,894,622 B2 | 5/2005 | Germagian et al. | |
| 6,922,347 B2 | 7/2005 | Lanni | |
| 6,923,676 B2 | 8/2005 | Perry | |
| 6,983,212 B2 | 1/2006 | Burns | |
| 7,015,599 B2 | 3/2006 | Gull et al. | |
| 7,050,312 B2 | 5/2006 | Tracy et al. | |
| 7,057,308 B2 | 6/2006 | Stranberg et al. | |
| 7,082,541 B2 | 7/2006 | Hammond et al. | |
| 7,132,833 B2 | 11/2006 | Layden et al. | |
| 7,141,891 B2 | 11/2006 | McNally et al. | |
| 7,142,950 B2 | 11/2006 | Rasmussen et al. | |
| 7,202,576 B1 | 4/2007 | Dechene et al. | |
| 7,242,111 B2 | 7/2007 | Menas et al. | |
| 7,259,477 B2 | 8/2007 | Klikic et al. | |
| 7,274,112 B2 | 9/2007 | Hjort et al. | |
| 7,301,249 B2 | 11/2007 | Stranberg et al. | |
| 7,352,083 B2 | 4/2008 | Nielsen et al. | |
| 7,402,921 B2 | 7/2008 | Ingemi et al. | |
| 7,432,615 B2 | 10/2008 | Hjort | |
| 7,446,433 B2 | 11/2008 | Masciarelli et al. | |
| 7,456,518 B2 | 11/2008 | Hjort et al. | |
| 7,521,823 B2 | 4/2009 | Klikic et al. | |
| 7,608,944 B2 | 10/2009 | Stranberg et al. | |
| 7,615,890 B2 | 11/2009 | Masciarelli et al. | |
| 7,615,891 B2 | 11/2009 | Wu et al. | |
| 2001/0005894 A1 | 6/2001 | Fukui | |
| 2001/0033502 A1 | 10/2001 | Blair et al. | |
| 2001/0034735 A1 | 10/2001 | Sugiyama | |
| 2002/0130556 A1 | 9/2002 | Hohri | |
| 2002/0136042 A1 | 9/2002 | Layden et al. | |
| 2002/0136939 A1 | 9/2002 | Grieve et al. | |
| 2002/0138785 A1 | 9/2002 | Hammond et al. | |
| 2003/0033550 A1 | 2/2003 | Kuiawa | |
| 2003/0048006 A1 | 3/2003 | Shelter, Jr. et al. | |
| 2003/0062775 A1 | 4/2003 | Sinha | |
| 2003/0076696 A1 | 4/2003 | Tsai | |
| 2003/0114963 A1 | 6/2003 | Walker | |
| 2004/0036361 A1 | 2/2004 | Dai et al. | |
| 2004/0104706 A1 | 6/2004 | Ooi et al. | |
| 2004/0148817 A1 * | 8/2004 | Kagoshima et al. | 37/348 |
| 2005/0029984 A1 | 2/2005 | Cheng et al. | |
| 2005/0071093 A1 | 3/2005 | Stefan | |
| 2005/0071699 A1 | 3/2005 | Hammond et al. | |
| 2005/0162129 A1 | 7/2005 | Mutabdzija et al. | |
| 2005/0201127 A1 | 9/2005 | Tracy et al. | |
| 2005/0227519 A1 | 10/2005 | Perry | |
| 2006/0170289 A1 | 8/2006 | Hong et al. | |
| 2006/0192436 A1 | 8/2006 | Stranberg et al. | |
| 2006/0238941 A1 | 10/2006 | Ingemi et al. | |
| 2007/0055409 A1 | 3/2007 | Rasmussen et al. | |
| 2007/0064363 A1 | 3/2007 | Nielsen et al. | |
| 2007/0216229 A1 | 9/2007 | Johnson, Jr. et al. | |
| 2008/0042491 A1 | 2/2008 | Klikic et al. | |
| 2008/0157602 A1 | 7/2008 | Stranberg et al. | |
| 2008/0158917 A1 * | 7/2008 | Chen | 363/34 |
| 2009/0160254 A1 | 6/2009 | Wu et al. | |
| 2009/0201703 A1 | 8/2009 | Klikic et al. | |
| 2009/0231892 A1 | 9/2009 | Klikic et al. | |
| 2009/0251002 A1 | 10/2009 | Cohen et al. | |
| 2009/0296432 A1 * | 12/2009 | Chapuis | 363/65 |
| 2009/0306914 A1 * | 12/2009 | Cohen | 702/60 |
| 2010/0049457 A1 | 2/2010 | Mutabdzija et al. | |
| 2010/0201194 A1 | 8/2010 | Masciarelli et al. | |

OTHER PUBLICATIONS

International Search Report and the Written Opinion of the International Searching Authority from International Application No. PCT/US2010/028780, dated Sep. 27, 2010.

Anren, Li. "Discussion on Load Rates, Efficiency, and Economic Operation of Distribution Transformers." Electrotechnical Journal, 2001, No. 4.

\* cited by examiner

SYSTEM AND METHOD FOR ESTIMATING AN EFFICIENCY OF A POWER DEVICE

BACKGROUND OF THE DISCLOSURE

1. Field of the Disclosure

At least one embodiment in accordance with the present disclosure relates generally to systems and methods for providing power and more specifically to control systems and methods used in a power device, such as an uninterruptible power supply (UPS), to measure and display the operating efficiency of the power device.

2. Discussion of Related Art

The use of power devices, such as an uninterruptible power supply, to provide regulated, uninterrupted power for sensitive and/or critical loads, such as computer systems and other data processing systems, is known. A number of different UPS products are available including those identified under the trade name Smart-UPS® from American Power Conversion Corporation of West Kingston, R.I. In a typical UPS, a battery is used to provide backup power for a critical load during blackout or brownout conditions. A user of a typical UPS is able to configure and control the UPS either through a computer coupled to the UPS or using through a user interface of the UPS itself.

SUMMARY OF THE DISCLOSURE

Aspects in accord with the present disclosure are directed to methods for estimating an efficiency of a power device. In one embodiment, the method comprises: identifying a state of operation of the power device; measuring power-related information produced by the power device; and determining an estimated efficiency of the power device based in part on the state of operation of the power device and power loss parameters associated with the power device by using the measured power-related information.

Embodiments of the method may be employed in an uninterruptible power supply in which the state of operation is one of a trim mode, a single boost mode, a double boost mode and a green mode. Determining the estimated efficiency includes determining estimated power losses from a look-up table, calculating an estimated input power by adding the current load and the estimated power losses, and/or measuring battery charging power loss when the battery is not fully charged. Calculating the estimated input power includes adding the battery charging power loss, if any, and/or adding other losses associated with the uninterruptible power supply, if any. The method further includes determining whether the power device is in a mode in which no losses are calculated. The method further includes displaying the estimated efficiency.

Another aspect of the disclosure is directed to a method for estimating an efficiency of a power device in which the method comprises: identifying a state of operation of the power device; measuring power-related information of the power device; determining estimated power losses based on the state of operation, power loss parameters associated with the power device, and the measured power-related information of the power device; calculating an estimated input power by adding power from the power-related information and the estimated power losses; and dividing the output power by the estimated input power.

Embodiments of the method may be employed in an uninterruptible power supply in which the state of operation is one of a trim mode, a single boost mode, a double boost mode and a green mode. The method further includes measuring battery charging power loss when a battery of the uninterruptible power supply is not fully charged. Calculating the estimated input power includes adding the battery charging power loss, if any, and/or adding other losses associated with the uninterruptible power supply, if any. Determining whether the uninterruptible power supply is in a mode in which no losses are calculated. The method further includes displaying the estimated efficiency.

A further aspect of the disclosure is directed to a power device comprising an input to receive estimated input power, a power supply circuit, coupled to the input, to provide power, an output, coupled to the power supply circuit, to provide output power derived from the power supply circuit, and a controller, coupled to the power supply circuit. The controller is configured to retrieve at least one stored procedure corresponding to estimating the efficiency of the power device. The stored procedure is configured to identify a state of operation of the power device, measure power-related information of the power device, determine estimated power losses based on the state of operation, power loss parameters associated with the power device, and the measured power-related information, calculate an estimated input power by adding power from the power-related information and the estimated power losses, and divide the output power by the estimated input power.

Embodiments of the power device may include an uninterruptible power supply in which the state of operation is one of a trim mode, a single boost mode, a double boost mode and a green mode. The stored procedure is further configured to measure battery charging power loss when a battery of the uninterruptible power supply is not fully charged, to calculate the estimated input power by adding the battery charging power loss, if any, to calculate the estimated input power by adding other losses associated with the uninterruptible power supply, if any, and/or to determine whether the uninterruptible power supply is in a mode in which no losses are calculated. The power device further includes a display to display the estimated efficiency.

Yet another aspect of the disclosure is directed to an uninterruptible power supply comprising an input to receive estimated input power, a power supply circuit, coupled to the input, to provide power, an output, coupled to the power supply circuit, to provide output power derived from the power supply circuit, and a controller, coupled to the power supply circuit. The controller is configured to retrieve at least one stored procedure corresponding to estimating the efficiency of the uninterruptible power supply by identifying a state of operation of the uninterruptible power supply, measuring the power-related information of the uninterruptible power supply, and determining estimated power losses from a look-up table based on the measured power-related information.

Embodiments of the uninterruptible power supply include identifying whether the state of operation is in one of a trim mode, a single boost mode, a double boost mode and a green mode. The uninterruptible power supply further includes a user interface, coupled to the controller, to display the information obtained from the controller, including the estimated efficiency of the uninterruptible power supply. The uninterruptible power supply further includes a battery, coupled to the power supply circuit, to provide battery power to the power supply circuit when estimated input power to the input is terminated. The stored procedure is further configured to measure battery charging power loss when the battery is not fully charged, to add the battery charging power loss, if any, and/or to determine whether the uninterruptible power supply is in a mode in which no losses are calculated.

Another aspect of the disclosure is directed to an uninterruptible power supply comprising an input to receive estimated input power, a power supply circuit, coupled to the input, to provide power, an output, coupled to the power supply circuit, to provide output power derived from the power supply circuit, and means for estimating an efficiency of the uninterruptible power supply by identifying a state of operation of the uninterruptible power supply, measuring the power-related information of the uninterruptible power supply, and determining estimated power losses from a look-up table based on the measured power-related information.

BRIEF DESCRIPTION OF DRAWINGS

The accompanying drawings are not intended to be drawn to scale. In the drawings, each identical or nearly identical component that is illustrated in various Figures is represented by a like numeral. For purposes of clarity, not every component may be labeled in every drawing. In the drawings.

DETAILED DESCRIPTION OF THE DISCLOSURE

Figure 1:
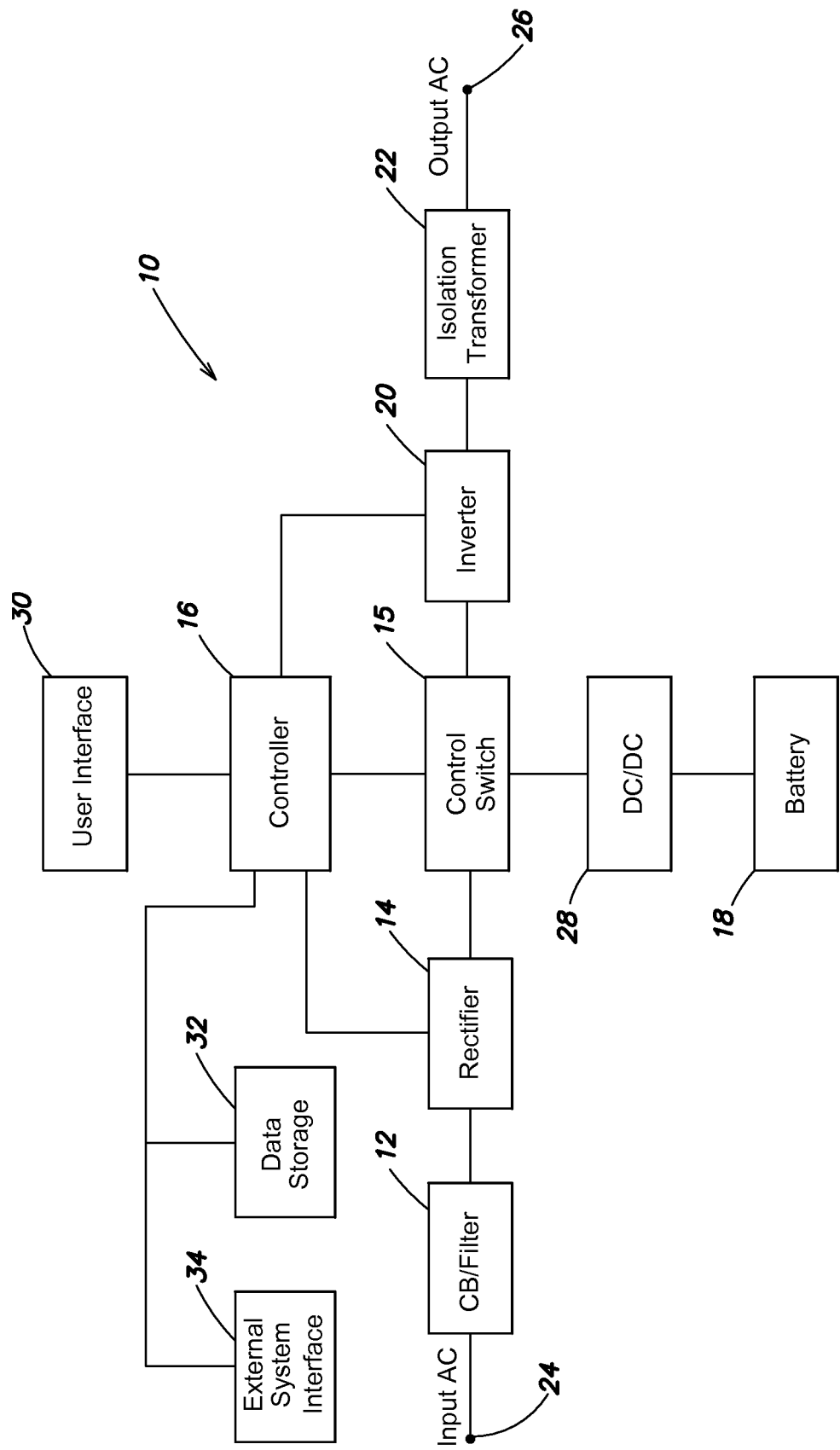
FIG. 1 is a schematic block diagram of a power device, such as a UPS, of an embodiment of the disclosure.

At least some embodiments in accordance with the present disclosure relate to systems and processes for providing improved control, monitoring and/or configuration of power devices, such as uninterruptible power supplies. Although the systems and processes disclosed herein are described when referencing an uninterruptible power supply, it should be understood that the applications disclosed herein are applicable to other types of power devices, such as outlet strips, power converters, line conditioners, surge protectors, power conditioners, Power Distribution Units (PDU) and Rack PDUs and the like.

The aspects disclosed herein in accordance with the present disclosure, are not limited in their application to the details of construction and the arrangement of components set forth in the following description or illustrated in the drawings. As described above, these aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

FIG. 1 shows an on-line UPS 10 used to provide regulated, uninterrupted power in accordance with one embodiment of the disclosure. The UPS 10 includes an input circuit breaker/filter 12, a rectifier 14, a control switch 15, a controller 16, a battery 18, an inverter 20, an isolation transformer 22, a DC/DC converter 28, a user interface 30, data storage 32 and external system interface 34. The UPS 10 also includes an input 24 for coupling to an AC power source, and an outlet 26 for coupling to a load.

The UPS 10 operates as follows. The circuit breaker/filter 12 receives input AC power from the AC power source through the input 24, filters the input AC power and provides filtered AC power to the rectifier 14. The rectifier 14 rectifies the input voltage. The DC/DC converter 28 regulates DC power from the battery 18. The control switch 15 receives the rectified power and also receives the DC power from the DC/DC converter 28. The controller 16 determines whether the power available from the rectifier 14 is within predetermined tolerances, and if so, controls the control switch 15 to provide the power from the rectifier 14 to the inverter 20. If the power from the rectifier 14 is not within the predetermined tolerances, which may occur because of "brown out" or "black out" conditions, or due to power surges, then the controller 16 controls the control switch 15 to provide the DC power from the battery 18 via DC/DC converter 28 to the inverter 20.

In the shown embodiment, the controller 16 is coupled to the rectifier 14, the control switch 15 and the inverter 20. The controller 16 is configured to receive information from the rectifier 14 when a "brown out" or "black out" condition occurs. Such a condition may occur when power to the input 24 is terminated. In other embodiments, the controller may be coupled the other components of the UPS 10 including the input 24, the breaker/filter 12, the isolation transformer 22, the DC/DC converter 28 and/or the battery 18.

In an alternative example, the battery is coupled to the rectifier circuit and the rectifier functions as a boost converter on-line mode of operation and on-battery mode of operation as described in U.S. Pat. No. 7,402,921, entitled "Method and Apparatus For Providing Uninterruptible Power," issued Jul. 22, 2008, which is hereby incorporated herein by reference in its entirety.

The inverter 20 of the UPS 10 receives DC power and converts the DC power to AC power and regulates the AC power to predetermined specifications. The inverter 20 provides the regulated AC power to the isolation transformer 22. The isolation transformer 22 is used to increase or decrease the voltage of the AC power from the inverter 20 and to provide isolation between a load and the UPS 10. The isolation transformer 22 is an optional device, the use of which is dependent on UPS output power specifications. Depending on the capacity of the battery 18 and the power requirements of the load, the UPS 10 can provide power to the load during brief power source dropouts or for extended power outages. The working components of the UPS 10 may together form part of a primary "power supply circuit," which may include the breaker/filter 12, the rectifier 14, the control switch 15 and the isolation inverter 20. The controller 16, the battery 18, the isolation transformer 22 and other components of the UPS 20 may form part of the power supply circuit as well.

Using data stored in associated memory, the controller 16 performs one or more instructions or procedures that may result in manipulated data, and the controller monitors and controls operation of the UPS 10. In some examples, the controller 16 may include one or more processors or other types of controllers. In one example, the controller 16 is a commercially available, general purpose processor. In another example, the controller 16 performs a portion of the functions disclosed herein on a general purpose processor and performs another portion using an application-specific integrated circuit (ASIC) tailored to perform particular operations. As illustrated by these examples, embodiments in accordance with the present disclosure may perform the operations described herein using many specific combinations of hardware and software and the disclosure is not limited to any particular combination of hardware and software components.

The data storage 32 stores computer readable and writable information required for the operation of the UPS 10. This information may include, among other data, data subject to manipulation by the controller 16 and instructions that are executable by the controller 16 to manipulate data. The data storage 32 may be a relatively high performance, volatile, random access memory, such as a dynamic random access memory (DRAM) or static memory (SRAM), or may be a nonvolatile storage media, such as magnetic disk or flash memory. Various embodiments in accord with the present disclosure can organize the data storage 32 into particularized and, in some cases, unique structures to perform the aspects and functions disclosed herein. In addition, these data structures may be specifically configured to conserve storage space or increase data exchange performance.

The external system interface 34 exchanges data with one or more external devices. These external devices may include any device configured to communicate using standards and protocols supported by the UPS 10. Examples of specific standards and protocols that the external system interface 34 may support include parallel, serial, and USB interfaces. Other examples of these supported protocols and standards include networking technologies such as UDP, TCP/IP and Ethernet technologies.

Figure 2:
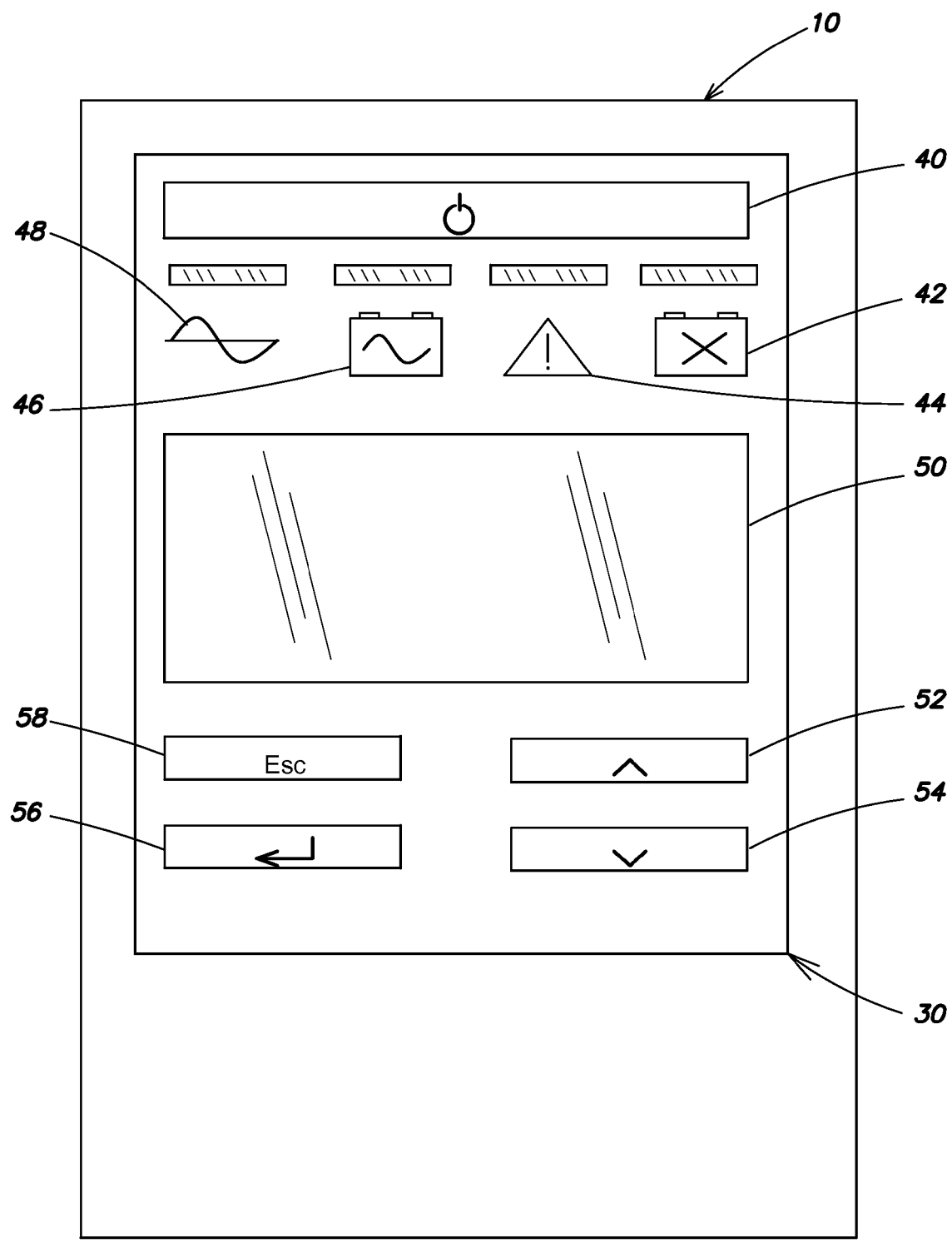
FIG. 2 is a view showing a user interface of the UPS.

Referring to FIG. 2, the exemplary user interface 30 includes a display screen and a set of keys through which a user of the UPS 10 can monitor, control and configure operation of the UPS 10. FIG. 2 depicts an external view of the UPS 10 including the user interface 30. The user interface 30 includes a power button 40, a replace battery indicator 42, a warning indicator 44, an on-battery power indicator 46, an on-line power indicator 48, an interface display 50, a scroll up button 52, a scroll down button 54, an enter button 56 and an escape button 58. The user interface 30 may embody any type of display or display screen known in the art.

The user interface 30 functions as follows. The power button 40, when actuated, will cause the UPS 10 to toggle between power-on and power-off states. According to some embodiments, the UPS 10 performs a series of accompanying actions to better manage these power state transitions.

The set of indicators 42, 44, 46 and 48 provide various information regarding current and prior states of the UPS 10. For example, the UPS 10 may determine by running a self-test that the battery 18 needs to be replaced. In this instance, the UPS 10 illuminates the replace battery indicator 42 to communicate this need.

The on-line power indicator 48 and the on-battery power indicator 46 signal the current source of power to the load. An active on-line power indicator 48 signals that the UPS 10 is providing power to the load in a normal operating fashion, i.e., the source of the power is the AC received through input 24. Conversely, the active on-battery power indicator 46 signals that the source of the power to the load is battery 18.

In another example, the UPS 10 may determine, for a variety of reasons, that the attention of an operator is needed. The reasons may include, among others, detection that the battery 18 is disconnected or that the battery 18 has been depleted by the load. In this case, the UPS 10 signals the need for operator attention by activating the warning indicator 44. In addition, the UPS 10 may provide a description of the reason for the warning in the interface display 50.

The interface display 50, which can be fashioned by a variety of hardware components including Liquid Crystal Displays and Light Emitting Diodes, presents a wide variety of information to an operator. This information may include monitoring information, such as the status warnings discussed above. In addition, this information may include configuration information and prompts through which the UPS 10 collects information from the user. Together, the display interface 50 and buttons 52, 54, 56 and 58 provide the UPS 10 with more flexibility in exchanging information with the user than is available using conventional UPS technology.

In one example, UPS 10 includes an interface structure that can be navigated by the user using the display interface 50 and buttons 52, 54, 56 and 58. This interface structure may include a variety of elements related to one another in various ways. For example, the interface structure may be a hierarchical menu structure. The behavior initiated by actuation of the buttons 52, 54, 56 and 58 is dependent upon the current location of the user in the interface structure, as is the information displayed in the display interface 50.

For example, the current location of the user may be an intermediate location within the interface structure, i.e. the current location connects to other elements of the interface structure. In this situation, the display interface 50 displays one of a list of the other elements of the interface structure connected to the user's current location and the buttons 52, 54, 56 and 58 are configured to provide navigational functions. In this mode, the user can move through, and cause the display interface 50 to display each element of, the list of the elements of the interface structure that are connected to the current location by using buttons 52 and 54. More precisely, the user can move up the list by actuating the scroll up button 52 and down the list by actuating the scroll down button 54. Furthermore, the user can navigate to the element of the interface structure currently displayed in interface 50 by actuating the enter button 56. Conversely, the user can navigate to the user's previous location in the interface structure by actuating the escape button 58.

In another example, the current location of the user in the interface structure may cause the UPS 10 to display review information to the user via the display interface 50. This review information may be any information stored within the UPS 10 and may include, among other information, configuration information, operational information and information regarding other devices in communication with the UPS 10, such as devices to which the UPS 10 supplies power. In one example, the display interface 50 displays an element belonging to a list of review information and the buttons 52, 54, 56 and 58 are configured to provide review functions. Under this configuration, the user can move through, and cause the display interface 50 to display each element of the list of review information. More specifically, and much like the navigational mode discussed above, the user can navigate up or down the list of review information by actuating the scroll up button 52 or the scroll down button 54. Furthermore, the user can navigate to the user's previous location in the interface structure by actuating the escape button 58. In at least some embodiments, actuation of the enter button 56, while in this mode, results in an error message explaining that the other keys are the valid keys at the user's current location within the interface structure.

According to another example, the current location of the user in the interface structure may cause the UPS 10 to prompt the user for information through the display interface 50. The information prompted for may be any information stored within the UPS 10 and may include, among other information, configuration information, information regarding the source of power into the UPS 10 and information regarding other devices in communication with the UPS 10, such as devices to which the UPS 10 supplies power. In this instance, the display interface 50 displays a prompt for information and the buttons 52, 54, 56 and 58 are configured to provide data entry functions. In this situation, the user can adjust the information displayed in the display interface 50 and enter answers to the prompts. More specifically, the user can change the answer to the prompt using the scroll up button 52 or the scroll down button 54. For example, a user can toggle a Boolean value from true to false or from yes to no, by actuating either of buttons 52 or 54. In another example, the user can increase or decrease a numerical answer displayed in the prompt by actuating the scroll up button 52 or the scroll down button 54. In still another example, the user can scroll up or down a list of answers using the scroll up button 52 or the scroll down button 54. In addition, the user can enter the currently displayed answer for the prompt by actuating the enter button 56. The user can also exit the prompt without saving the currently displayed answer by actuating the escape key 58. Thus, the particular arrangement and function of the user interface 30 provides users with sundry advantages over conventional UPS interfaces.

The user interface shown in FIG. 2 may be implemented in other embodiments using different configurations of buttons, different styles of buttons and using display screens of different sizes.

While embodiments of the disclosure have been described herein for use with an on-line UPS, other embodiments may be used with other UPS topologies including off-line and line interactive UPSs. Further, at least some embodiments described herein may be used with power supplies other than UPSs and in other electronics systems.

In certain embodiments, methods for estimating an efficiency of a power device, such as a UPS, are disclosed herein. In one embodiment, the controller 16 is configured to obtain information from one or more of the working components of the UPS 10 including but not limited to the input 24, the power supply circuit (e.g., the input circuit breaker/filter 12, the rectifier 14, the control switch 15, the controller 16, the battery 18, the inverter 20, the isolation transformer 22, and/or the DC/DC converter 28), and the output 26 to estimate the efficiency of the UPS. Based on this information, which may constitute one or more power loss parameters associated with the UPS, and the operational state of the UPS, an estimated efficiency of the UPS may be determined.

Although an on-line UPS has been described herein, the methods and systems described herein may be applied to other types of UPSs as well. For example, the UPS may be a line interactive UPS, which is similar to off-line and on-line UPSs in that it switches to battery power when a blackout occurs. However, when a power line sag or swell occurs, at least one type of line interactive UPS activates a tap switching voltage regulation circuit to stabilize the output voltage continuously, without consuming battery power. The tap switching voltage regulation circuit often includes an automatic voltage regulation (AVR) transformer, which operates in single boost, double boost or trim modes. One example of a line interactive UPS may be found in U.S. patent application Ser. No. 12/360,648, entitled "System and Method for Limiting Losses in an Uninterruptible Power Supply," filed Jan. 27, 2009, which is hereby incorporated herein by reference in its entirety.

In one embodiment, the method includes measuring the current load produced at the output 26. Although measuring the current load at the output 26 is set forth herein, the measurement may take place at the control switch 15, the inverter 20 and/or the isolation transformer and still fall in the scope of the present disclosure. In one example, once the current load is measured, the estimated efficiency may be determined from information taken from a look-up table by using the sensed current load of the uninterruptible power supply. An exemplary look-up table is set forth in Table 1.

TABLE 1

| AVR Average Losses (Watts) | | | |
| --- | --- | --- | --- |
| % VA | Double Boost | Single Boost | Trim |
| 10 | 8.11 | 11.32 | 16.20 |
| 20 | 9.46 | 11.78 | 16.57 |
| 30 | 11.70 | 12.54 | 17.2 |
| 40 | 14.84 | 13.60 | 18.09 |
| 50 | 18.88 | 14.97 | 19.22 |
| 60 | 23.82 | 16.65 | 20.60 |
| 70 | 29.65 | 18.63 | 22.24 |
| 80 | 36.38 | 20.91 | 24.13 |
| 90 | 36.38 | 23.50 | 26.27 |
| 100 | 36.38 | 26.39 | 28.66 |

Each column of Table 1 includes losses based off the percentage of volt amps (VA), which is the maximum power available to the load, in ten percent (10%) increments. Each column includes ten data point losses based on the percentage of VA, e.g., ten percent (10%), twenty percent (20%), thirty percent (30%) and so on. Based on the AVR state of operation, and the percentage of VA, the unit will index the appropriate data point.

Figure 3:
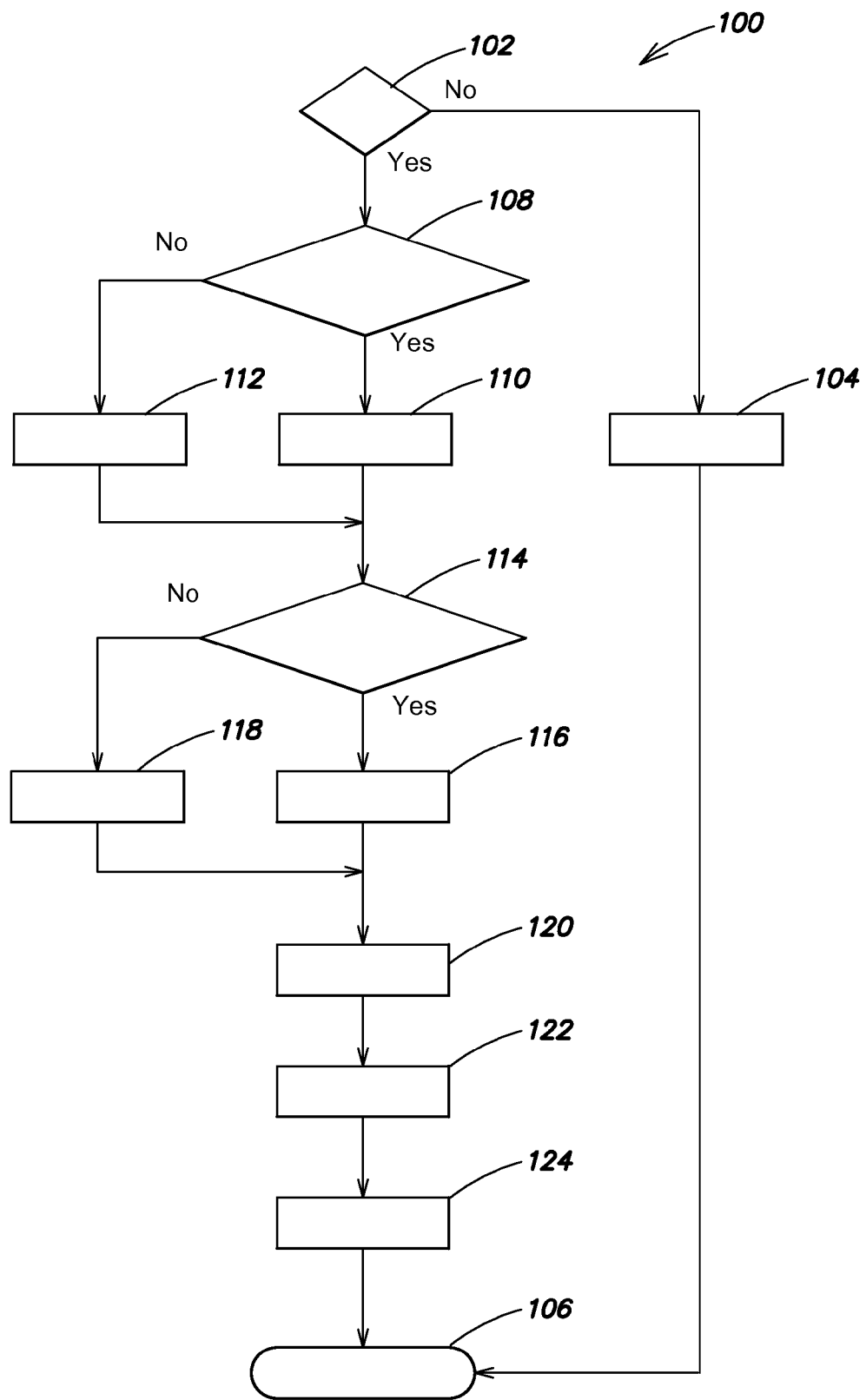
FIG. 3 is a flowchart showing a method of calculating an estimated efficiency of the UPS of an embodiment of the disclosure.

Turning now to FIG. 3, there is generally indicated at 100 an exemplary routine for estimating efficiency of a UPS. At decision 102, it is determined whether the UPS is on-line. If not on-line, the efficiency is determined to be zero percent at processing step 104 and the routine ends at 106. Once the routine 100 ends, the controller 16 may be programmed to continuously repeat the routine on a periodic basis to recalculate the estimated efficiency. In other embodiments, the operator may initiate the routine 100 through the user interface 30. If on-line, the routine proceeds to decision 108, where the state of operation is determined. When in a "green mode," the automatic voltage regulator (AVR) loss is determined to be "0" at processing step 110 and the routine proceeds. If not in "green mode," the AVR loss is calculated at processing step 112 by using the look-up table set forth in Table 1 based on the identified state of operation and the load percentage (AV) of the UPS.

For example, when referencing Table 1, at 112, the state of operation of the UPS is identified. As shown, when not in a "green mode," the UPS is in trim, single boost or double boost mode. In addition, the maximum power available to the load is further identified. Thus, for example, if the UPS is determined to be in trim mode and the load percentage is 60%, then the AVR loss is 20.60 Watts. In other embodiments, a loss equation may be provided to calculate AVR loss. Once the AVR loss is determined based on the state of operation, the routine proceeds to decision 114.

At decision 114, it is determined whether the battery is fully charged to have one hundred percent (100%) capacity. If fully charged, the battery charging power is determined to be zero at processing step 116 and the routine proceeds. If not fully charged, the battery charging power is measured at processing step 118. In one embodiment, the battery charging power may be a fixed power number, e.g., 114 Watts. In certain embodiments, a battery discharge/recharge routine may be performed. By completely discharging and recharging the battery, performance indicators of that particular battery may be determined without assuming a nominal battery performance.

Once the battery charging power loss is measured or otherwise obtained, a charger power consumption is calculated at processing step 120. In one embodiment, the charger power consumption is calculated by the following equation:

$$\text{Est. Charger Power Consumption} = \text{Battery Charging Power} + \text{Logic Supply Power} * C \quad (1)$$

As shown, an estimated charger power consumption is calculated by adding the battery charging power and the logic supply power. The logic supply power is multiplied by a constant C associated with the particular UPS and the state of operation of the UPS.

Next, an estimated input power is calculated at processing step 122. In one embodiment, the estimated input power is calculated by the following equation:

$$\text{Est. Input Power} = \text{Output Power} + \text{AVR Losses} + \text{Battery Charging Power} \quad (2)$$

Efficiency may then be calculated at 124 processing step by dividing the output power by the estimated input power and multiplying the result by 100. After calculating efficiency, the routine ends at 106. Once the routine 100 ends, the controller 16 may be programmed to continuously repeat the routine on a periodic basis to recalculate the estimated efficiency or the operator may initiate the routine 100 through the user interface 30.

As shown and described above with reference to Table 1, for a line interactive UPS, there are provided three AVR loss columns. Thus, for the UPS described herein, efficiency may be determined when the UPS is in a single boost mode, a double boost mode or a trim mode, as well as "green mode." For example, if the input voltage at the UPS is in a sag condition and the output voltage needs to be increased, the UPS controller adjusts the AVR (by means of one or more AVR relays) to a boost mode (a "single" boost mode). For example, in the boost mode, the voltage at the output of an AVR transformer may be increased, in relation to the voltage at the input of the AVR transformer, by a first ratio. In another example, if the output voltage needs to be increased by a greater ratio, the AVR is adjusted by the UPS controller to an increased boost mode (a "double" boost mode). For example, in the increased boost mode, the voltage at the output of the AVR transformer may be increased by a second ratio which is greater than the first ratio. In one embodiment, the second ratio may be double the value of the first ratio. In trim mode, the AVR operates to reduce voltage from the input to the output.

Other conditions may impact the determination of an estimated efficiency of a power device. For example, environmental conditions in which the apparatus operates will affect the efficiency of the apparatus. For the UPS 10 illustrated in FIG. 1, the sensor 82 may be used to obtain environmental data, for example, such as the temperature and humidity of a room in which the UPS operates. Based on the environmental data obtained by the sensor 82, the efficiency model may be manipulated to reflect the effect these environmental conditions on the UPS. In addition, operational losses associated with the UPS may be factored as well. Thus, equation (2) may be modified as follows to take into account these external conditions:

$$\text{Est. Input Power} = \text{Output Power} + \text{AVR Losses} + \text{Battery Charging Power} + \text{External Losses} \quad (3)$$

EXAMPLES

The AVR loss is determined from Table 1 based on the state of operation of the UPS and the percentage of the output VA of the UPS. The battery loss depends on the capacity of the battery and whether the battery is partially or fully charged. In a circumstance in which the battery is fully charged, the power loss associated with the battery is zero. When not fully charged, a power loss associated with the estimated charger power consumption must be calculated. Thus, losses associated with charging the battery will effect the efficiency of the UPS by lowering the efficiency. The logic supply power loss is a constant based on the type of UPS. Such logic supply power loss may include losses of power associated with operating the controller, operating the related housekeeping circuitry, operating the relays, and running the fan that cools the controller. These losses may be estimated based on the type of UPS. Additionally, environmental effects and operational losses may be considered as well.

The following are several examples of how efficiency is calculated for a UPS based on the following assumptions:

| Output VA 50%, Battery Capacity 85% | |
|---|---|
| Output: | 576.0 Watts |
| AVR (Trim): | 19.2 Watts |
| Battery Loss: | 134.1 Watts |
| Logic Supply Loss: | 12.9 Watts |
| Efficiency: | 77.6% |
| Output VA 50%, Battery Capacity 100% | |
| Output: | 576.0 Watts |
| AVR (Trim): | 19.2 Watts |
| Battery Loss: | 0.0 Watts |
| Logic Supply Loss: | 12.9 Watts |
| Efficiency: | 94.7% |
| Output VA 80%, Battery Capacity 85% | |
| Output: | 921.6 Watts |
| AVR (Trim): | 24.1 Watts |
| Battery Loss: | 134.1 Watts |
| Logic Supply Loss: | 12.9 Watts |
| Efficiency: | 84.3% |
| Output VA 80%, Battery Capacity 100% | |
| Output: | 921.6 Watts |
| AVR (Trim): | 24.1 Watts |
| Battery Loss: | 0.0 Watts |
| Logic Supply Loss: | 12.9 Watts |
| Efficiency: | 96.1% |
| Output VA 100%, Battery Capacity 85% | |
| Output: | 1152.0 Watts |
| AVR (Trim): | 28.7 Watts |
| Battery Loss: | 134.1 Watts |
| Logic Supply Loss: | 12.9 Watts |
| Efficiency: | 86.8% |
| Output VA 100%, Battery Capacity 100% | |
| Output: | 1152.0 Watts |
| AVR (Trim): | 19.2 Watts |
| Battery Loss: | 0.0 Watts |
| Logic Supply Loss: | 12.9 Watts |
| Efficiency: | 96.5% |
| Output VA 100%, Battery Capacity 85% | |
| Output: | 1152.0 Watts |
| AVR (Green): | 0.0 Watts |
| Battery Loss: | 134.1 Watts |
| Logic Supply Loss: | 12.9 Watts |
| Efficiency: | 88.7% |
| Output VA 100%, Battery Capacity 100% | |
| Output: | 1152.0 Watts |
| AVR (Green): | 0.0 Watts |
| Battery Loss: | 0.0 Watts |
| Logic Supply Loss: | 12.9 Watts |
| Efficiency: | 98.9% |
| Output VA 100%, Battery Capacity 85% | |
| Output: | 1152.0 Watts |
| AVR (Single): | 26.4 Watts |
| Battery Loss: | 134.1 Watts |
| Logic Supply Loss: | 12.9 Watts |
| Efficiency: | 86.9% |

-continued

| Output VA 100%, Battery Capacity 100% | |
|---|---|
| Output: | 1152.0 Watts |
| AVR (Single): | 26.4 Watts |
| Battery Loss: | 0.0 Watts |
| Logic Supply Loss: | 12.9 Watts |
| Efficiency: | 96.7% |

| Output VA 100%, Battery Capacity 85% | |
|---|---|
| Output: | 1152.0 Watts |
| AVR (Double): | 36.4 Watts |
| Battery Loss: | 134.1 Watts |
| Logic Supply Loss: | 12.9 Watts |
| Efficiency: | 86.3% |

| Output VA 100%, Battery Capacity 100% | |
|---|---|
| Output: | 1152.0 Watts |
| AVR (Double): | 36.4 Watts |
| Battery Loss: | 0.0 Watts |
| Logic Supply Loss: | 12.9 Watts |
| Efficiency: | 95.9% |

As illustrated in the foregoing examples, efficiency is improved by having a fully charged battery since power is not being diverted to charge the battery. Efficiency is also improved when the UPS is operating in "green mode" since there are no AVR losses. In addition, it should be observed that efficiency is increased when the percentage of power available to the load is increased.

Figure 4:
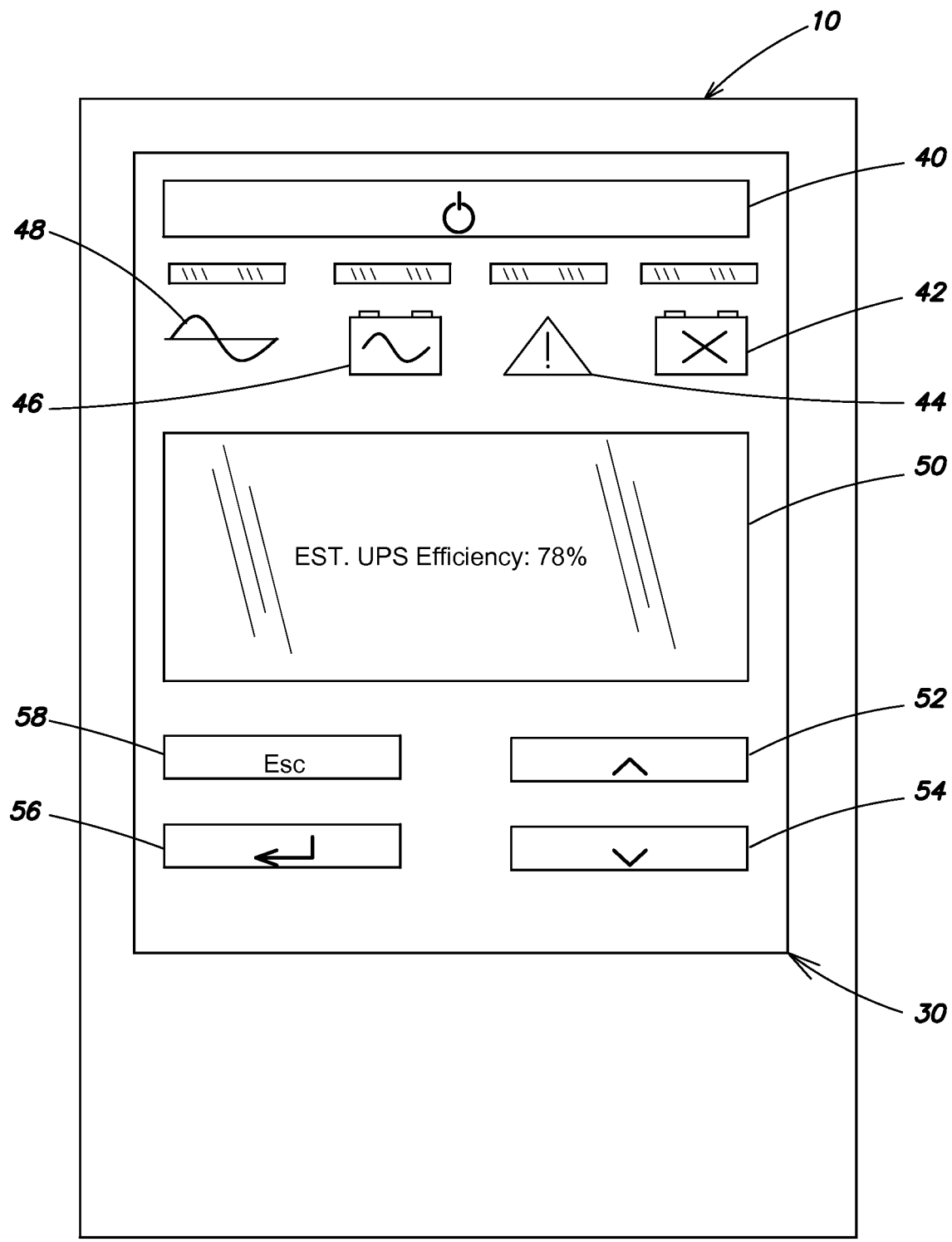
FIG. 4 is a view showing the user interface of the UPS displaying an exemplary estimated efficiency of the UPS.

Referring to FIG. 4, the user interface 30 may be configured to display the efficiency of the UPS. For example, FIG. 4 illustrates interface display 50 reading "UPS Efficiency: 78%." Efficiency may be calculated on an on-going basis and periodically reported to the user. In other embodiments, the efficiency may be requested by the user through the user interface 30.

Thus, it should be observed that an estimated efficiency may be calculated without having to calculate an actual efficiency of the UPS. It should be understood that estimated efficiency may be estimated for any power device, not only a UPS, such as and not limited to outlet strips, power converters, line conditioners, surge protectors, power conditioners, Power Distribution Units (PDU) and Rack PDUs and the like. Although a look-up table is utilized for determining AVR losses, it should be understood that such losses may be determined by employing a loss equation for the particular UPS.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method for estimating an operating efficiency of a power device coupled to a battery and at least one power source separate from the power device, the method comprising:
   identifying, by a controller of the power device, a state of operation of the power device in which the power device receives input power from the at least one power source and provides output power to a load separate from the power device;
   determining battery charging power including power provided to the battery to increase a state-of-charge of the battery;
   measuring at least one characteristic related to the output power;
   calculating an estimated input power of the power device received from the at least one power source based on the at least one characteristic and the battery charging power; and
   determining an estimated operating efficiency of the power device in providing the output power while operating in the state of operation based on output power loss parameters associated with the power device and the estimated input power.

2. The method of claim 1, wherein the power device is an uninterruptible power supply.

3. The method of claim 2, wherein the state of operation is one of a trim mode, a single boost mode, a double boost mode and a green mode.

4. The method of claim 2, wherein determining the estimated operating efficiency includes determining estimated power losses from a look-up table.

5. The method of claim 4, wherein determining the estimated operating efficiency further includes calculating an estimated input power by adding a current load and the estimated power losses.

6. The method of claim 4, wherein determining the battery charging power includes measuring the battery charging power when the battery is not fully charged.

7. The method of claim 6, wherein calculating the estimated input power includes adding the battery charging power, if any.

8. The method of claim 7, wherein calculating the estimated input power further includes adding other losses associated with the uninterruptible power supply, if any.

9. The method of claim 1 further comprising determining whether the power device is in a mode in which no losses are calculated.

10. The method of claim 1 further comprising displaying the estimated operating efficiency.

11. A method for estimating an operating efficiency of a power device coupled to a battery and at least one power source separate from the power device, the method comprising:
    identifying, by a controller of the power device, a state of operation of the power device in which the power device receives input power from the at least one power source and provides output power to a load separate from the power device;
    determining battery charging power including power provided to the battery to increase a state-of-charge of the battery;
    measuring at least one characteristic related to the output power;
    determining estimated losses in the output power while the power device operates in the state of operation based on power loss parameters associated with the power device and the at least one characteristic related to the output power;
    calculating an estimated input power of the power device received from the at least one power source by adding an output power value determined using the at least one characteristic related to the output power, the battery charging power, and the estimated losses in the output power; and
    dividing the output power by the estimated input power.

12. The method of claim 11, wherein the power device is an uninterruptible power supply.

13. The method of claim 12, wherein the state of operation is one of a trim mode, a single boost mode, a double boost mode and a green mode.

14. The method of claim 12 wherein determining the battery charging power includes measuring the battery charging power when a battery of the uninterruptible power supply is not fully charged.

15. The method of claim 14, wherein calculating the estimated input power includes adding the battery charging power, if any.

16. The method of claim 14, wherein calculating the estimated input power further includes adding other losses associated with the uninterruptible power supply, if any.

17. The method of claim 12 further comprising determining whether the uninterruptible power supply is in a mode in which no losses are calculated.

18. The method of claim 12 further comprising displaying the estimated operating efficiency.

19. A power device comprising:
    an input to receive input power from at least one power source separate from the power device;
    a power supply circuit, coupled to the input, to provide power;
    a battery coupled to the power supply circuit;
    an output, coupled to the power supply circuit, to provide output power derived from the power supply circuit; and
    a controller, coupled to the power supply circuit, the controller being configured to retrieve at least one stored procedure corresponding to estimating an operating efficiency of the power device, the stored procedure being configured to:
        identify a state of operation of the power device in which the power device receives the input power via the input and provides the output power to a load separate from the power device,
        determine battery charging power including power provided to the battery to increase a state-of-charge of the battery;
        measure at least one characteristic related to the output power,
        determine estimated losses in the output power based on the state of operation, power loss parameters associated with the power device, and the at least one characteristic related to the output power,
        calculate an estimated input power of the power device received from the at least one power source by adding an output power value determined from the at least one characteristic related to the output power, the battery charging power, and the estimated losses in the output power, and
        divide the output power by the estimated input power.

20. The power device of claim 19, wherein the power device is an uninterruptible power supply.

21. The power device of claim 20, wherein the state of operation is one of a trim mode, a single boost mode, a double boost mode and a green mode.

22. The power device of claim 21, wherein the stored procedure is further configured to determine the battery charging power by measuring the battery charging power when the a battery of the uninterruptible power supply is not fully charged.

23. The power device of claim 20 wherein the stored procedure is further configured to calculate the estimated input power by adding the battery charging power, if any.

24. The power device of claim 23, wherein the stored procedure is further configured to calculate the estimated input power by adding other losses associated with the uninterruptible power supply, if any.

25. The power device of claim 20, wherein the stored procedure is further configured to determine whether the uninterruptible power supply is in a mode in which no losses are calculated.

26. The power device of claim 19 further comprising a display to display the estimated operating efficiency.

27. An uninterruptible power supply comprising:
    an input to receive input power from at least one power source separate from the uninterruptible power supply;
    a power supply circuit, coupled to the input, to provide power;
    a battery coupled to the power supply circuit;
    an output, coupled to the power supply circuit, to provide output power derived from the power supply circuit; and
    a controller, coupled to the power supply circuit, the controller being configured to retrieve at least one stored procedure corresponding to estimating an estimated operating efficiency of the uninterruptible power supply by:
        identifying a state of operation of the uninterruptible power supply in which the uninterruptible power supply receives the input power via the input and provides the output power to a load separate from the uninterruptible power supply,
        determining battery charging power including power provided to the battery to increase a state-of-charge of the battery;
        measuring at least one characteristic related to the output power,
        determining estimated losses in the output power from a look-up table based on the at least one characteristic related to the output power, and
        calculating an estimated input power of the uninterruptible power supply received from the at least one power source by adding an output power value determined from the at least one characteristic related to the output power, the battery charging power loss, and the estimated losses in the output power.

28. The uninterruptible power supply of claim 27, wherein the state of operation is one of a trim mode, a single boost mode, a double boost mode and a green mode.

29. The uninterruptible power supply of claim 27 further comprising a user interface, coupled to the controller, to display the information obtained from the controller, including the estimated operating efficiency of the uninterruptible power supply.

30. The uninterruptible power supply of claim 27 further comprising a battery, coupled to the power supply circuit, to provide battery power to the power supply circuit when the input power to the input is terminated.

31. The uninterruptible power supply of claim 30, wherein the stored procedure is further configured to determine the battery charging power by measuring the battery charging power when the battery is not fully charged.

32. The uninterruptible power supply of claim 31, wherein the stored procedure is further configured to add the battery charging power, if any.

33. The uninterruptible power supply of claim 27, wherein the stored procedure is further configured to determine whether the uninterruptible power supply is in a mode in which no losses are calculated.

34. An uninterruptible power supply comprising:
    an input to receive input power from at least one power source separate from the uninterruptible power supply;

a power supply circuit, coupled to the input, to provide power;

a battery coupled to the power supply circuit;

an output, coupled to the power supply circuit, to provide output power derived from the power supply circuit; and means for estimating an operating efficiency of the uninterruptible power supply by identifying a state of operation of the uninterruptible power supply in which the uninterruptible power supply receives the input power via the input and provides the output power to a load separate from the uninterruptible power supply, determining battery charging power including power provided to the battery to increase a state-of-charge of the battery, measuring at least one characteristic related to the output power, determining estimated losses in the output power from a look-up table based on the at least one characteristic related to the output power, and calculating an estimated input power of the uninterruptible power supply received from the at least one power source by adding an output power value determined from the at least one characteristic related to the output power, the battery charging power, and the estimated losses in the output power.

\* \* \* \* \*